(12) United States Patent
Hatsukade et al.

(10) Patent No.: US 8,548,542 B2
(45) Date of Patent: Oct. 1, 2013

(54) SQUID MAGNETIC SENSOR

(75) Inventors: Yoshimi Hatsukade, Toyohashi (JP);
Saburo Tanaka, Toyohashi (JP); Sho Kanai, Toyohashi (JP)

(73) Assignee: National University Corporation, Toyohashi University of Technology, Toyohashi-shi Aichi (JP)

( * ) Notice: Subject to any disclaimer, the term of this patent is extended or adjusted under 35 U.S.C. 154(b) by 198 days.

(21) Appl. No.: 13/264,027

(22) PCT Filed: Apr. 13, 2010

(86) PCT No.: PCT/JP2010/002665
§ 371 (c)(1),
(2), (4) Date: Oct. 12, 2011

(87) PCT Pub. No.: WO2010/122733
PCT Pub. Date: Oct. 28, 2010

(65) Prior Publication Data
US 2012/0053059 A1 Mar. 1, 2012

(30) Foreign Application Priority Data
Apr. 23, 2009 (JP) .................................. 2009-105709

(51) Int. Cl.
*G01R 33/035* (2006.01)
(52) U.S. Cl.
USPC ........................................................ 505/162
(58) Field of Classification Search
USPC .................. 505/162, 846; 324/248
See application file for complete search history.

(56) References Cited

U.S. PATENT DOCUMENTS 5,955,400 A * 9/1999 Yokosawa et al. ............. 505/162
5,986,280 A * 11/1999 Kugai .............................. 257/34

FOREIGN PATENT DOCUMENTS

| EP | 0 753 757 A2 | | 1/1997 |
|---|---|---|---|
| JP | 3-78675 | * | 4/1991 |
| JP | 03-078675 A | | 4/1991 |
| JP | 7-92247 | * | 4/1995 |
| JP | 07-092247 A | | 4/1995 |
| JP | 08-316538 A | | 11/1996 |
| JP | 10-48303 | * | 2/1998 |
| JP | 10-048303 A | | 2/1998 |
| JP | 2001-091611 A | | 4/2001 |

OTHER PUBLICATIONS

English Translation of International Preliminary Report on Patentability, dated Nov. 17, 2011, for PCT/JP2010/002665.

(Continued)

*Primary Examiner* — Colleen Dunn
(74) *Attorney, Agent, or Firm* — Bacon & Thomas, PLLC

(57) ABSTRACT

There is provided a directly-coupled high-temperature superconductor SQUID magnetic sensor in a single thin film structure, which suppresses flux trapping or jumping generated in the sensor in a magnetic field, prevents the degradation in performance of the SQUID sensor, and operates stably with high sensitivity even in the magnetic field. The SQUID magnetic sensor including a bi-crystal substrate 1 having a bi-crystal grain boundary, pickup loops 7a-7d formed from a first high-temperature superconducting thin film on the bi-crystal substrate 1, and a SQUID ring 3 formed from the first high-temperature superconducting thin film on the bi-crystal grain boundary, directly connected with the pickup loops 7a-7d, wherein a plurality of pickup loops 7a-7d are disposed equally spaced from a bi-crystal grain boundary line 2 so as not to overlap with the bi-crystal grain boundary.

11 Claims, 4 Drawing Sheets

(56) References Cited

OTHER PUBLICATIONS

Selders, Peter et al., Reduction of 1/fNoise in HTS-SQUIDs by Artificial Defects, IEEE Trans. Appl. Supercond., vol. 9, No. 2, pp. 2967-2970, Jun. 1999.

* cited by examiner

SQUID MAGNETIC SENSOR

BACKGROUND OF THE INVENTION

1. Field of the Invention

The present invention relates to a directly-coupled high-temperature superconductor SQUID (Superconducting QUantum Interference Device) magnetic sensor in a single thin film structure having high sensitivity, which operates stably even in the environmental magnetic noise without the use of a magnetic shield or the like.

2. Description of the Related Art

The high-temperature superconductor SQUIDs are adequately sensitive magnetic sensors. However, directly-coupled high-temperature superconductor SQUID magnetic sensors in a single thin film structure using bi-crystal grain boundary junctions produce flux trapping/jumping when subjected to a magnetic field of tens to hundreds of nT, resulting in the unstable operation (for example, see Non-Patent Document 1). As such, when using the high-temperature superconductor SQUID magnetic sensors in the magnetic field for measurements or using the sensors in an environment with high magnetic field noise, it has been difficult to maintain the stable operation of the SQUID magnetic sensors without compromising the high sensitivity.

Non-Patent Document 1: Peter Selders, et al., "Reduction of 1/f-Noise in HTS-SQUIDs by Artificial Defects", IEEE Trans. Appl. Supercond., vol. 9, no. 2, pp. 2967-2970, 1999

SUMMARY OF THE INVENTION

FIGS. 1 and 2 show a conventional common directly-coupled high-temperature superconductor SQUID magnetic sensor using bi-crystal grain boundary junctions, wherein FIG. 1 shows an overall view and FIG. 2 shows an enlarged view of a SQUID ring area (a part of A in FIG. 1). In FIGS. 1 and 2, reference numeral 101 denotes a bi-crystal substrate, 102 denotes a bi-crystal grain boundary line, 103 denotes a pickup loop, 104A, 104B denote bi-crystal grain boundary junctions (bi-crystal Josephson junctions: weak link), 105 denotes a cutout, and 106 denotes a SQUID ring.

As shown in these figures, this type of SQUID has the structure where the SQUID ring 106 is positioned on the bi-crystal grain boundary line 102 of the bi-crystal substrate 101. In such a pattern, the pickup loop 102 is formed of a superconducting thin film having wide bi-crystal grain boundary junctions (weak link) covering a large area over the bi-crystal grain boundary line 102 of the bi-crystal substrate 101.

On cooling this SQUID in a magnetic field, magnetic flux is more likely to be pinned in the bi-crystal grain boundary junctions 104A, 104E of the SQUID ring 106 and the pickup loop 103 on the bi-crystal grain boundary 102, as compared to the remaining portions without grain boundaries. When the magnetic field is applied to the SQUID, the magnetic field generates shielding current in the pickup loop 103 or the SQUID ring 106, producing a Lorentz force between the shielding current and the pinned magnetic flux. If this Lorentz force is greater than the weak pinning force acting on the bi-crystal grain boundary junctions 104A, 104B and the pickup loop 103 on the bi-crystal grain boundary 102, the magnetic flux pinned at the bi-crystal grain boundary junctions 104A, 104B and the pickup loop 103 on the bi-crystal grain boundary 102 jumps to a location having lower energy on the superconducting thin film, leading to the flux creep that causes the continuous random movement of a plurality of magnetic fluxes. In particular, if the magnetic flux is trapped in the bi-crystal grain boundary junctions 104A, 104B of the SQUID ring 106, the performance of the SQUID magnetic sensor degrades and the sensitivity thereof is decreased, leading to the difficulty in the long-time stable operation of the SQUID magnetic sensor. Therefore, the SQUID magnetic sensor in such a pattern has the lower magnetic field robustness, and thus it is difficult to use it in measurements conducted in an environment with high magnetic field noise or in the magnetic field.

In fact, in a test for the magnetic field robustness of the directly-coupled high-temperature superconductor SQUID magnetic sensor in a single thin film structure having the pattern in FIG. 1, fabricated to have a size of the pickup loop 103 of 8 mm×8 mm, the bi-crystal grain boundary junctions 104A, 104B of the SQUID ring 106, and the bi-crystal grain boundary junctions in the pickup loop 103, it was found that the sensitivity of the sensor was decreased due to the generation of flux trapping/jumping in a 100 Hz AC magnetic field with an amplitude of approximately 100 nT, resulting in the unstable operation.

Accordingly, in order to solve the problems of the decrease in sensitivity and the unstable operation in the magnetic field as described above, the present invention is directed to provide a high-sensitive SQUID magnetic sensor which reduces the flux trapping/jumping at the bi-crystal grain boundary junctions of the SQUID ring, so as to operate stably even in the magnetic field.

In order to achieve the above-described problems, the present invention provides the following:

[1] A high-temperature superconductor SQUID (Superconducting QUantum Interference Device) magnetic sensor comprising: a bi-crystal substrate having a bi-crystal grain boundary; a pickup loop formed from a first high-temperature superconducting thin film on the bi-crystal substrate; and a SQUID ring formed from the first high-temperature superconducting thin film on the bi-crystal grain boundary, directly connected with the pickup loop, wherein a plurality of the pickup loops are disposed equally spaced from a bi-crystal grain boundary line so as not to overlap with the bi-crystal grain boundary.

[2] The high-temperature superconductor SQUID magnetic sensor according to [1] above, wherein the pickup loops are each disposed on either side of a cross shape formed of a single bi-crystal grain boundary line and a line perpendicular thereto.

[3] The high-temperature superconductor SQUID magnetic sensor according to [1] or [2] above, wherein the SQUID ring formed on the bi-crystal grain boundary is covered with a second high-temperature superconducting thin film.

[4] The high-temperature superconductor SQUID magnetic sensor according to [3] above, wherein the second high-temperature superconducting thin film covers at least a spacing formed by any two adjacent pickup loops.

[5] The high-temperature superconductor SQUID magnetic sensor according to [4] above, wherein the second high-temperature superconducting thin film covers'one-half or more of a line width of each of the two adjacent pickup loops that form the spacing therebetween.

[6] The high-temperature superconductor SQUID magnetic sensor according to [4] above, wherein an insulating film is formed between the pickup loops along with the SQUID ring and the second high-temperature superconducting thin film.

[7] The high-temperature superconductor SQUID magnetic sensor according to [4] above, wherein the insulating film comprises $CeO_2$.

[8] The high-temperature superconductor SQUID magnetic sensor according to [4] above, wherein the insulating film comprises STO.

[9] The high-temperature superconductor SQUID magnetic sensor according to any one of [3] to [8] above, comprising a second substrate including the second high-temperature superconducting film formed on its surface and an insulating film laminated on the top face of the second high-temperature superconducting thin film, wherein the second substrate and the bi-crystal substrate are integrated to form a flip-chip structure via the insulating film.

EFFECT OF THE INVENTION

By using the directly-coupled high-temperature superconductor SQUID magnetic sensor in the single thin film structure including the superconducting thin film which covers the SQUID ring and the divided pickup loops, according to the present invention, the small magnetic field measurements can be conducted stably in a relatively high magnetic field. In addition, the magnetic trapping in the SQUID ring area can be reduced and the magnetic flux can be linked effectively to the pickup loops, so that the characteristics and sensitivity of the SQUID are improved.

Therefore, according to the present invention, measurements of small magnetic signals by moving the sensor closer to ferromagnetic materials which could not have been measured, and measurements of small magnetic signals in an environment having high magnetic noise are made possible.

DESCRIPTION OF THE PREFERRED EMBODIMENTS

Figure 3:
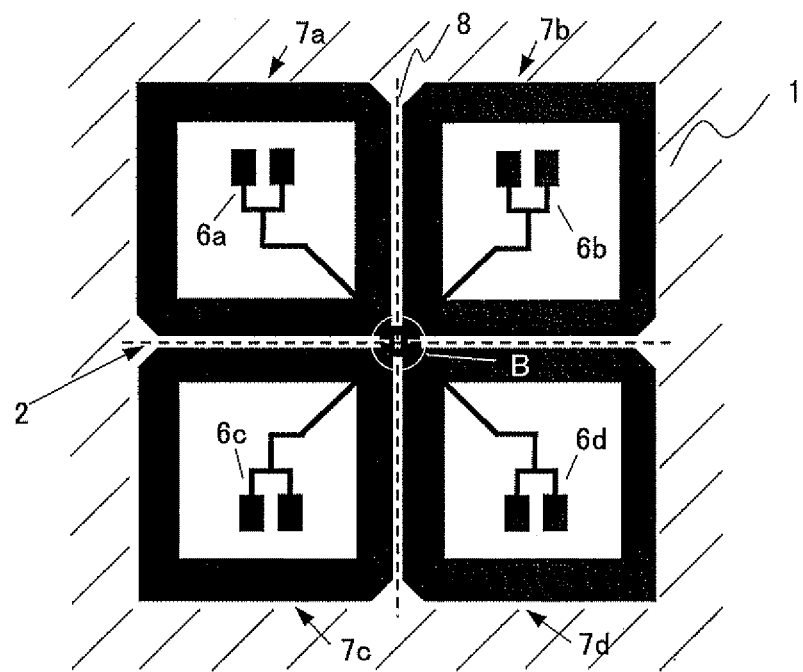
FIG. 3 shows an embodiment of the a directly-coupled high-temperature superconductor SQUID magnetic sensor in the single thin film structure having divided pickup loops, according to the present invention.
Figure 4:
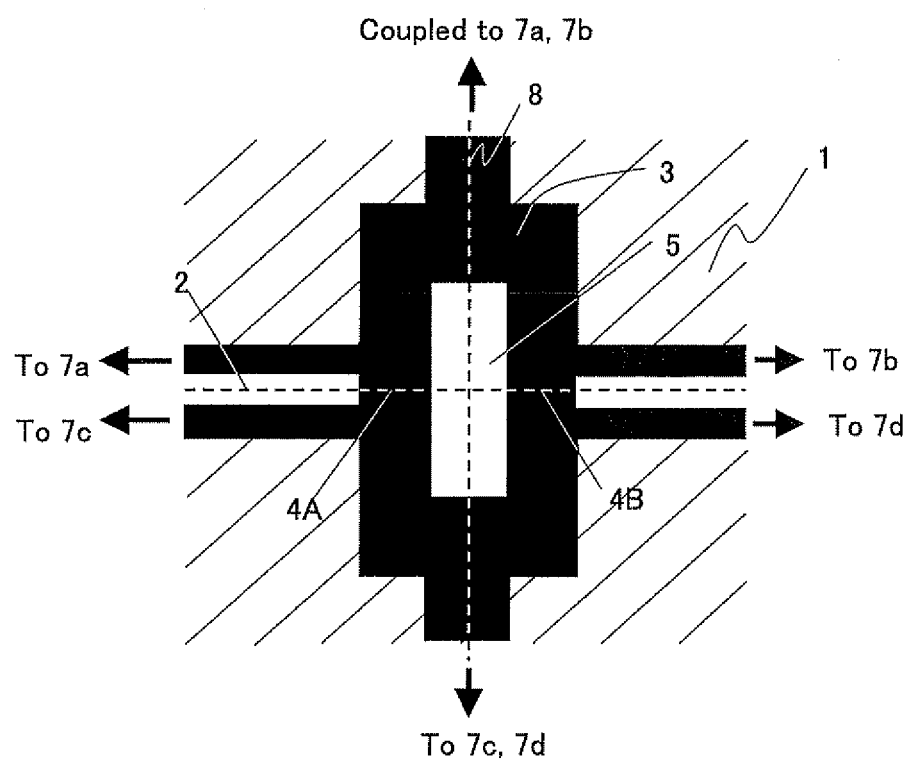
FIG. 4 shows an enlarged view of a SQUID ring area of the directly-coupled high-temperature superconductor SQUID magnetic sensor in the single thin film structure shown in FIG. 3.

FIGS. 3 and 4 show an embodiment of a directly-coupled high-temperature superconductor SQUID magnetic sensor in a single thin film structure according to the present invention, wherein FIG. 3 shows an overall view and FIG. 4 shows an enlarged view of a SQUID ring area (a part of B in FIG. 3). In these figures, reference numeral 1 denotes a bi-crystal substrate, 2 denotes a bi-crystal grain boundary line of the bi-crystal substrate 1, 3 denotes a SQUID ring, 4A, 4B denote bi-crystal grain boundary junctions (Josephson junction), 5 denotes a cutout, 6a-6d denote electrodes (e.g., Ag deposited on a high-temperature superconducting film) connected to voltage/current terminals, and 7a-7d denote divided pickup loops (each 1.5 mm×1.5 mm in size) coupled with the SQUID ring 3. Reference numeral 8 denotes a line perpendicular to the bi-crystal grain boundary line 2 of the bi-crystal substrate 1.

The material of the by-crystal substrate 1 is STO ($SrTiO_3$), for example, on which 200 nm in thickness of YBCO is epitaxially grown. While the bonding angle of the bi-crystal substrate 1 can take any of 24°, 30°, 36°, and 45°, the angle of 30° was used in this embodiment. The desirable structure would be that the pickup loops are divided so that no bi-crystal grain boundary junction (Josephson junction) is present in the pickup loops, and thus the pickup loops 7a-7d are not positioned on the bi-crystal grain boundary line 2 of the bi-crystal substrate 1. In this manner, sections in the pickup loops 7a-7d, which tend to produce magnetic flux pinning, can be eliminated. Although the pickup loops are divided into four in this embodiment, they may be divided into two, four or more as long as no pickup loop is positioned on the bi-crystal grain boundary line 2 of the bi-crystal substrate 1.

Figure 5:
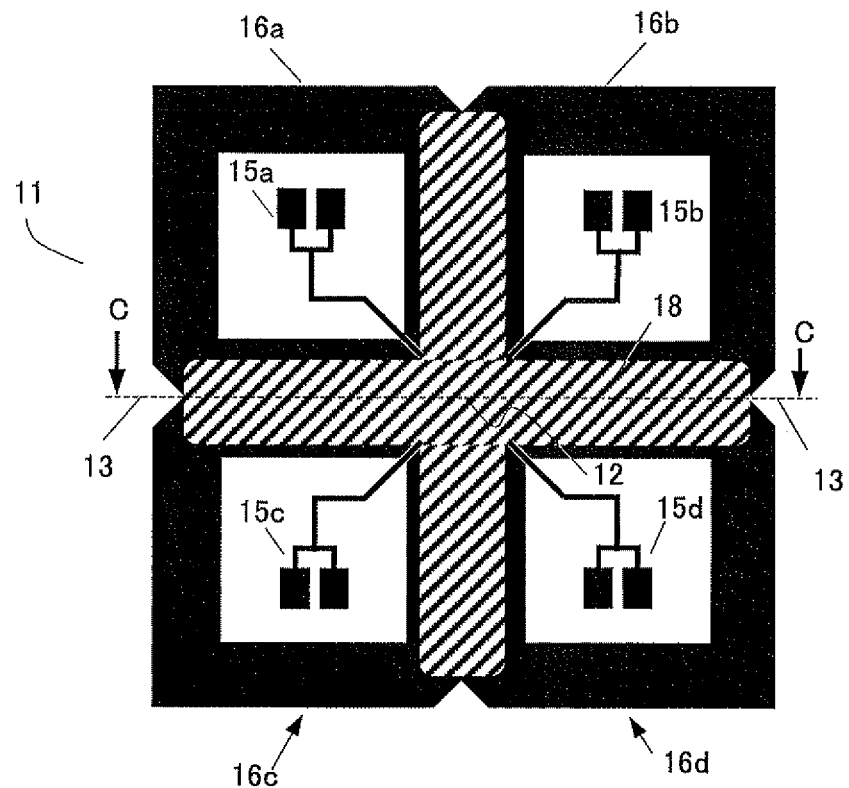
FIG. 5 shows mounting of a superconducting thin film on the directly-coupled high-temperature superconductor SQUID magnetic sensor in the single thin film structure shown in FIG. 3.
Figure 6:
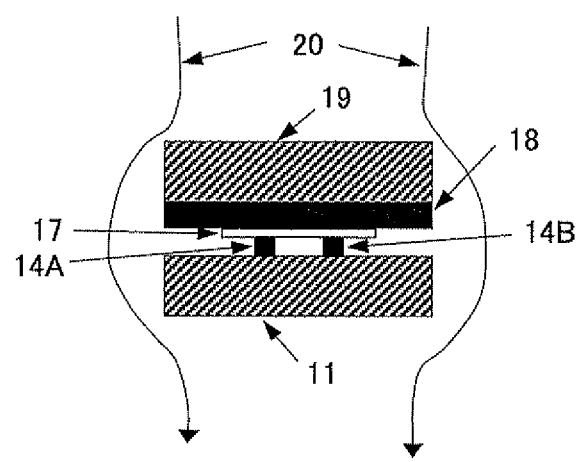
FIG. 6 shows a cross-sectional view of the directly-coupled high-temperature superconductor SQUID magnetic sensor in the single thin film structure with the superconducting film mounted thereon shown in FIG. 5, taken along the line C-C along a bi-crystal grain boundary line.

FIGS. 5 and 6 show the directly-coupled high-temperature superconductor SQUID magnetic sensor in the single thin film structure according to the present invention and a superconducting thin film mounted thereon to form a flip-chip structure, wherein FIG. 5 shows a top view and FIG. 6 shows a cross-sectional view taken along the line C-C along the bi-crystal grain boundary line shown in FIG. 5. In these figures, reference numeral 11 denotes a bi-crystal substrate, 12 denotes a SQUID ring, 13 denotes a bi-crystal grain boundary line, 14A, 14B denote bi-crystal grain boundary junctions (Josephson junctions), 15a-15d denote electrodes (e.g., Ag deposited on the high-temperature superconducting thin film) connected to voltage/current terminals, and 16a-16d denote divided pickup loops (each 1.5 mm×1.5 mm in size) coupled with the SQUID ring 12. Reference numeral 17 denotes an insulating layer, 18 denotes a superconducting thin film, 19 denotes a substrate (e.g., an STO substrate with 0.5 mm in thickness), and 20 denotes an external magnetic flux.

The superconducting thin film 18 covering over the substrate 11 of the SQUID magnetic sensor is desirably disposed to cover the SQUID ring 12 and the entire spacing between the divided pickup loops 16a-16d. For mounting and bonding the superconducting thin film 18 to the surface of the SQUID magnetic sensor, and electrically insulating between the SQUID magnetic sensor and the superconducting thin film 18, it is desirable to use the insulating layer 17 providing great adhesiveness even at cryogenic temperature. In addition, in order to enhance the effect of suppressing the flux trapping/jumping at the SQUID ring 12, the thickness of the insulating layer 17 is desirably made to be very thin (e.g., 1 μm). Moreover, in order for the magnetic flux that passes through the spacing of the divided pickup loops 16a-16d to effectively linking with the pickup loops 16a-16d, it is desirable to dispose the superconducting layer 18 having a width sufficient to cover the width of spacing of the pickup loops 16a-16d as well as one-half or more of a line width of each of the two adjacent pickup loops (e.g., 16a and 16b) that forms the spacing therebetween. This prevents the magnetic flux to pass through the spacing of the pickup loops 16a-16d and contributes to obtain the greater magnetic flux sensitivity.

Figure 7:
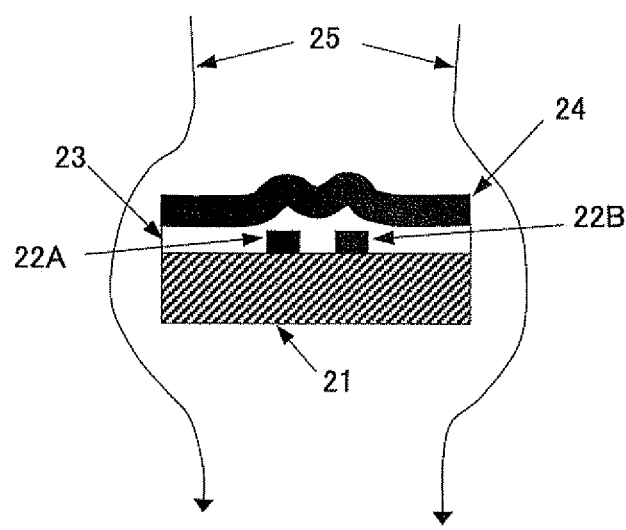
FIG. 7 shows a cross-sectional view taken along a bi-crystal grain boundary, illustrating the case where a superconducting layer is laminated on the directly-coupled high-temperature superconductor SQUID magnetic sensor in the single thin film structure shown in FIG. 3 via a thin insulating layer.

FIG. 7 shows a cross-sectional view of another form of the superconducting thin film covering over the substrate of the SQUID magnetic sensor. In this figure, reference numeral 21 denotes a bi-crystal substrate, 22A, 22B denote bi-crystal grain boundary junctions, 23 denotes an insulating layer (e.g., $CeO_2$ or STO), 24 denotes a superconducting thin film, and 25 denotes an external magnetic flux. On the basis of the directly-coupled high-temperature superconductor SQUID magnetic sensor in the single thin film structure using the divided pickup loops as shown in FIG. 3, the structure of the SQUID magnetic sensor having the superconducting thin film 24 laminated thereon via the insulating layer 23, as shown in FIG. 7, is expected to provide the similar effect as the flip-chip structure shown in FIGS. 5 and 6.

It is considered that such a superconducting thin film 24 laminated on the SQUID magnetic sensor with a very narrow spacing (e.g., 200 nm) therebetween can provide the similar effect as the superconducting thin film 11 shown in FIG. 6, and it is also desirable to made the insulating layer 23 as thin as possible.

EXAMPLES

The experiments were conducted to verify the performance of the embodiments described above.

Example 1

The performance of the SQUID magnetic sensor was experimentally verified for the directly-coupled high-temperature superconductor SQUID magnetic sensor in the single thin film structure, as shown in FIG. 3, fabricated to have the size of each pickup loop of 1.5 mm×1.5 mm and the bi-crystal Josephson junctions, that was cooled using liquid nitrogen (boiling point of 77K). The result showed that, when the 100 Hz magnetic field was applied, the SQUID operated stably up to the magnetic field of 0.75 μT.

Comparative Example

Figure 1:
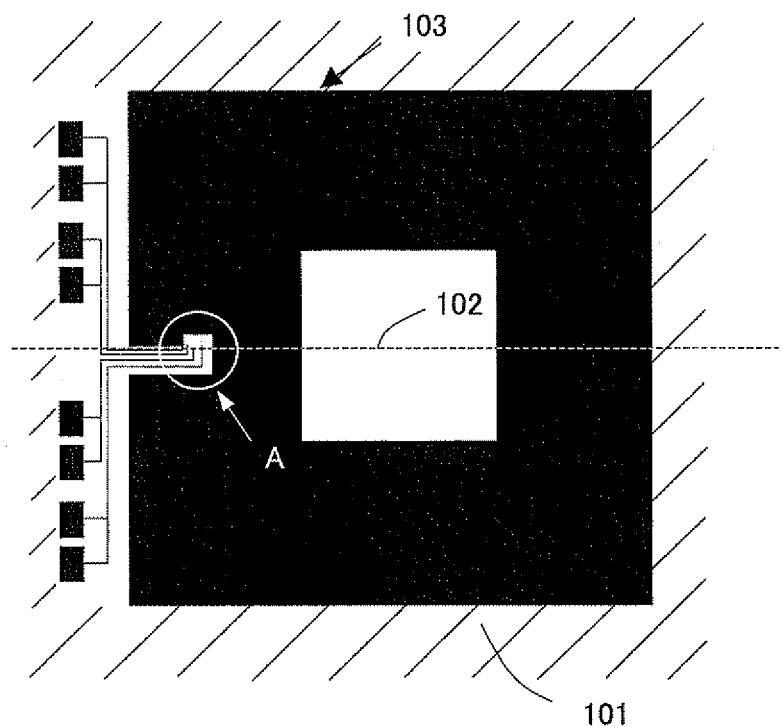
FIG. 1 shows a conventional directly-coupled high-temperature superconductor SQUID magnetic sensor in a single thin film structure.
Figure 2:
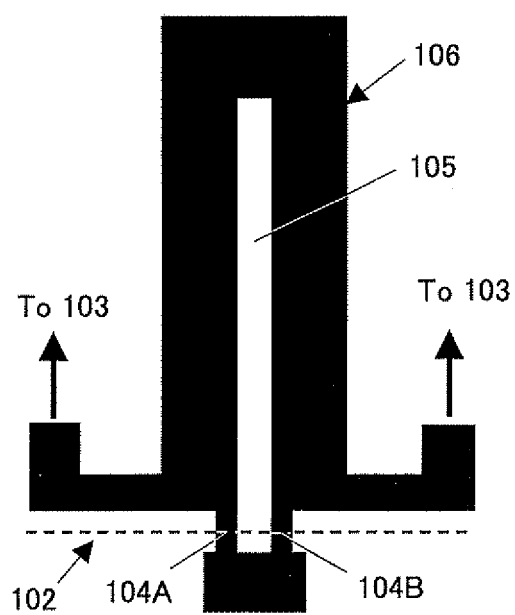
FIG. 2 shows an enlarged view of a SQUID ring area of the directly-coupled high-temperature superconductor SQUID magnetic sensor in the single thin film structure shown in FIG. 1.

As a comparative example, the performance of the SQUID magnetic sensor was experimentally verified for the directly-coupled high-temperature superconductor SQUID magnetic sensor in the single thin film structure, as shown in FIG. 1, fabricated to have the size of the pickup loop of 8 mm×8 mm and the bi-crystal Josephson junctions, that was cooled using liquid nitrogen (boiling point of 77K), similar to Example 1. The result showed that, when the 100 Hz magnetic field was applied, the SQUID operation became unstable at the magnetic field of 0.1 pT, which revealed that the magnetic field robustness was inferior to Example 1.

Example 2

The performance of the SQUID magnetic sensor was experimentally verified for the directly-coupled high-temperature superconductor SQUID magnetic sensor in the single thin film structure, as shown in FIG. 3, fabricated to have the size of each pickup loop of 1.5 mm×1.5 mm and the bi-crystal Josephson junctions, that was cooled using liquid nitrogen (boiling point of 77K), and for the sensor as shown in FIGS. 5 and 6, fabricated to have the flip-chip structure of the bi-crystal substrate 11 and the SQUID magnetic sensor.

Table 1 shows characteristics of the SQUID sensor with and without the superconducting thin film mounted thereon. For the SQUID magnetic sensor without the superconducting thin film, critical current, amplitude of external magnetic field at which the SQUID magnetic sensor becomes to operate unstably, effective flux trapping area, and a white flux noise level were 14 μA, 0.75 μT, 0.066 mm², and 20 $\mu\phi_0/Hz^{1/2}$ respectively. On the other hand, for the same SQUID magnetic sensor with the superconducting thin film, the values were 28.4 μA, 3.6 μT, 0.085 mm², and 14 $\mu\phi_0/Hz^{1/2}$, respectively, meaning the improvement in the critical current in approximately twice, the effective flux trapping area in approximately five times, and the white flux noise level in approximately 30%. From these results, it was found that the present invention allows the improvement in the SQUID performances, such as the white flux noise level representing the sensitivity and the effective area, as well as the magnetic field robustness.

TABLE 1

|  | Without Superconducting Thin Film | With Superconducting Thin Film |
|---|---|---|
| Critical Current at Josephson Junction (μA) | 14 | 28.4 |
| Amplitude of Magnetic Field that Caused Unstability (μT) | 0.75 | 3.6 |
| Effective Area (mm²) | 0.066 | 0.085 |
| White Flux Noise Level ($\mu\phi_0/Hz^{1/2}$) | 20 | 14 |

INDUSTRIAL APPLICABILITY

The directly-coupled high-temperature superconductor SQUID magnetic sensor in the single thin film structure having the superconducting thin film mounted thereon, according to the present invention, is applicable in small magnetic field measurements in an environment in the absence of an expensive magnetic shield or highly-sensitive magnetic field measurements in a magnetic field, and also applicable to various apparatuses that require measurements of ferromagnetic materials.

What is claimed is:

1. A high-temperature superconductor SQUID (Superconducting QUantum Interference Device) magnetic sensor comprising:
    a bi-crystal substrate having a bi-crystal grain boundary;
    a pickup loop formed from a first high-temperature superconducting thin film on the bi-crystal substrate; and
    a SQUID ring formed from the first high-temperature superconducting thin film on the bi-crystal grain boundary, directly connected with the pickup loop,
    wherein a plurality of the pickup loops are disposed equally spaced from a bi-crystal grain boundary line so as not to overlap with the bi-crystal grain boundary,
    and wherein the SQUID ring formed on the bi-crystal grain boundary is covered with a second high-temperature superconducting thin film, and the second high-temperature superconducting thin film covers at least a spacing formed by any two adjacent pickup loops.

2. The high-temperature superconductor SQUID magnetic sensor according to claim 1, wherein the pickup loops are each disposed on either side of a cross shape formed of a single bi-crystal grain boundary line and a line perpendicular thereto.

3. The high-temperature superconductor SQUID magnetic sensor according to claim 1, wherein the second high-temperature superconducting thin film covers one-half or more of a line width of each of the two adjacent pickup loops that form the spacing therebetween.

4. The high-temperature superconductor SQUID magnetic sensor according to claim 1, wherein an insulating film is formed between the pickup loops along with the SQUID ring and the second high-temperature superconducting thin film.

5. The high-temperature superconductor SQUID magnetic sensor according to claim 4, wherein the insulating film comprises $CeO_2$.

6. The high-temperature superconductor SQUID magnetic sensor according to claim 4, wherein the insulating film comprises STO.

7. The high-temperature superconductor SQUID magnetic sensor according to claim 1, comprising a second substrate including the second high-temperature superconducting film formed on its surface and an insulating film laminated on the top face of the second high-temperature superconducting thin film, wherein the second substrate and the bi-crystal substrate are integrated to form a flip-chip structure via the insulating film.

8. The high-temperature superconductor SQUID magnetic sensor according to claim 3, comprising a second substrate including the second high-temperature superconducting film formed on its surface and an insulating film laminated on the top face of the second high-temperature superconducting thin film, wherein the second substrate and the bi-crystal substrate are integrated to form a flip-chip structure via the insulating film.

9. The high-temperature superconductor SQUID magnetic sensor according to claim 4, comprising a second substrate including the second high-temperature superconducting film formed on its surface and an insulating film laminated on the top face of the second high-temperature superconducting thin film, wherein the second substrate and the bi-crystal substrate are integrated to form a flip-chip structure via the insulating film.

10. The high-temperature superconductor SQUID magnetic sensor according to claim 5, comprising a second substrate including the second high-temperature superconducting film formed on its surface and an insulating film laminated on the top face of the second high-temperature superconducting thin film, wherein the second substrate and the bi-crystal substrate are integrated to form a flip-chip structure via the insulating film.

11. The high-temperature superconductor SQUID magnetic sensor according to claim 6, comprising a second substrate including the second high-temperature superconducting film formed on its surface and an insulating film laminated on the top face of the second high-temperature superconducting thin film, wherein the second substrate and the bi-crystal substrate are integrated to form a flip-chip structure via the insulating film.

\* \* \* \* \*